United States Patent
Ozawa

(10) Patent No.: US 8,822,960 B2
(45) Date of Patent: Sep. 2, 2014

(54) CHARGED PARTICLE BEAM DRAWING APPARATUS AND ARTICLE MANUFACTURING METHOD USING SAME

(75) Inventor: Kimitaka Ozawa, Utsunomiya (JP)

(73) Assignee: Canon Kabushiki Kaisha (JP)

(*) Notice: Subject to any disclaimer, the term of this patent is extended or adjusted under 35 U.S.C. 154(b) by 83 days.

(21) Appl. No.: 13/412,013

(22) Filed: Mar. 5, 2012

(65) Prior Publication Data

US 2012/0228516 A1 Sep. 13, 2012

(30) Foreign Application Priority Data

Mar. 7, 2011 (JP) .................................. 2011-048529
Mar. 2, 2012 (JP) .................................. 2012-046126

(51) Int. Cl.
*H01J 37/28* (2006.01)

(52) U.S. Cl.
USPC .......................... 250/492.3; 250/397; 250/310

(58) Field of Classification Search
CPC ........................................................ H01J 37/28
USPC ..................................................... 250/492.3
See application file for complete search history.

(56) References Cited

U.S. PATENT DOCUMENTS

| | | | |
|---|---|---|---|
| 6,570,155 B1 * | 5/2003 | Prior et al. ..................... | 250/311 |
| 7,244,932 B2 * | 7/2007 | Nakasuji et al. ............... | 250/306 |
| 7,893,411 B2 | 2/2011 | Nishimura et al. | |
| 2011/0114853 A1 * | 5/2011 | Kobayashi ................ | 250/396 R |

FOREIGN PATENT DOCUMENTS

JP 2009-88202 A 4/2009

* cited by examiner

*Primary Examiner* — Phillip A Johnston
(74) *Attorney, Agent, or Firm* — Rossi, Kimms & McDowell LLP

(57) ABSTRACT

The charged particle beam drawing apparatus of the present invention is a charged particle beam drawing apparatus that renders a pattern on a substrate using a charged particle beam and includes a detector that detects charge amount depending on the irradiation of the charged particle beam; first and second deflectors that are arranged along the direction of the irradiation of the charged particle beam and are capable of deflecting the charged particle beam; and a controller that controls the first and second deflectors, wherein the controller transmits a signal, which is used for switching the irradiation/nonirradiation of the charged particle beam to the detector, to the first and second deflectors at a predetermined timing, and adjusts the operation timing of the first and second deflectors based on the output of the detector depending on the signal.

8 Claims, 7 Drawing Sheets

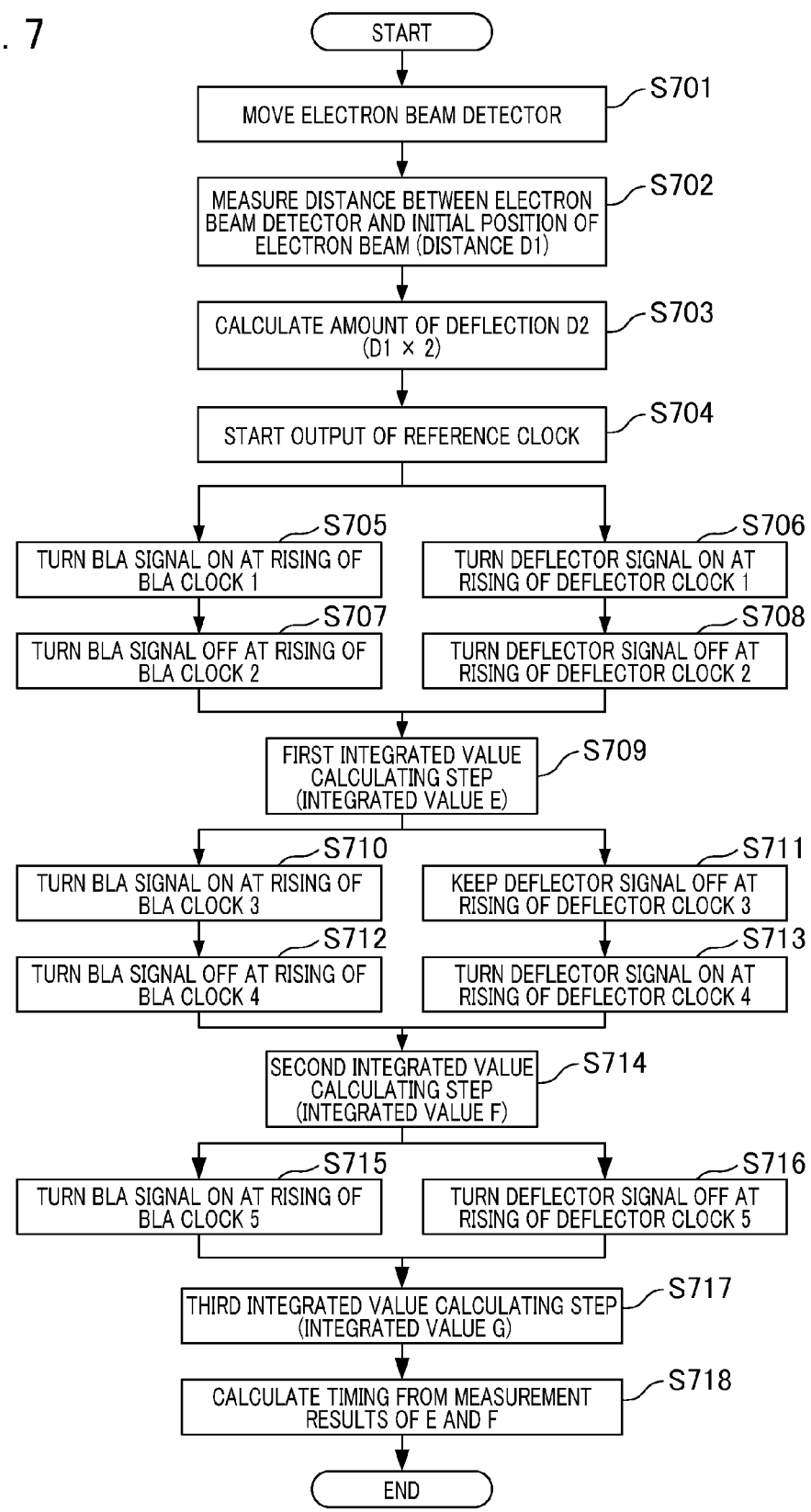

CHARGED PARTICLE BEAM DRAWING APPARATUS AND ARTICLE MANUFACTURING METHOD USING SAME

BACKGROUND OF THE INVENTION

1. Field of the Invention

The present invention relates to a drawing apparatus that renders drawing data on a substrate using charged particle beams such as electron beams or the like, and an article manufacturing method using the same.

2. Description of the Related Art

In recent years, as micronization of the element, increasingly complex circuit patterns, or a higher capacity of pattern data advance, the drawing accuracy as well as drawing throughput of drawing apparatuses for use in the manufacturing of devices such as semiconductor integrated circuits need to be improved. As a method for realizing that ideal, a multiple beam-type charged particle beam drawing apparatus is known in which a plurality of electron beams (charged particle beams) is deflected or the ON/OFF operation of the irradiation of electron beams is independently controlled so as to draw predetermined drawing data at the predetermined position of a substrate to be treated. Here, in order to achieve further improvements in drawing throughput using the drawing apparatus, electron beams need to be deflected at high speed with high accuracy. However, for example, when a position control deflector for controlling the irradiation position of electron beams by a deflection amplifier is employed, a settling time for the output voltage is needed depending on the load applied thereto during driving of the position control deflector. Also, if electron beams are illuminated onto a sample surface during the settling time, such illumination may adversely affect the drawing result. Thus, a blanking deflector must be activated during the settling time so as not to allow irradiation of electron beams. Accordingly, it is desired that the time when the activation of the blanking deflector is started coincide with the timing at which a voltage is applied to the position control deflector during the movement of the irradiation position of electron beams. Japanese Patent Laid-Open No. 2009-88202 discloses a charged electron beam drawing apparatus that compares the line widths of the pattern rendered by changing the timing so as to determine an appropriate timing from the predetermined allowable range of the amount of offset among the line widths, and a drawing method using the same.

However, in the drawing method disclosed in Japanese Patent Laid-Open No. 2009-88202, additional steps such as rendering drawing data on a substrate to be treated, developing the substrate, and the like need to be performed in order to adjust the timing.

SUMMARY OF THE INVENTION

Accordingly, the present invention provides a charged particle beam drawing apparatus that adjusts the operation timing between a blanking deflector and a position control deflector at high speed with high accuracy and is advantageous in achieving further improvements in drawing throughput.

According to an aspect of the present invention, a charged particle beam drawing apparatus that renders a pattern on a substrate using a charged particle beam is provided that includes a detector that detects charge amount depending on the irradiation of the charged particle beam; first and second deflectors that are arranged along the direction of the irradiation of the charged particle beam and are capable of deflecting the charged particle beam; and a controller that controls the first and second deflectors, wherein the controller transmits a signal, which is used for switching the irradiation/nonirradiation of the charged particle beam to the detector, to the first and second deflectors at a predetermined timing, and adjusts the operation timing of the first and second deflectors based on the output of the detector depending on the signal.

According to the present invention, a charged particle beam drawing apparatus that adjusts the operation timing between a blanking deflector and a position control deflector at high speed with high accuracy and is advantageous in achieving further improvements in drawing throughput may be provided.

Further features of the present invention will become apparent from the following description of exemplary embodiments with reference to the attached drawings.

BRIEF DESCRIPTION OF THE DRAWINGS

FIG. 7 is a flowchart illustrating the timing adjusting step according to the third embodiment.

DESCRIPTION OF THE EMBODIMENTS

Hereinafter, preferred embodiments of the present invention will be described with reference to the drawings.
(First Embodiment)

Figure 1:
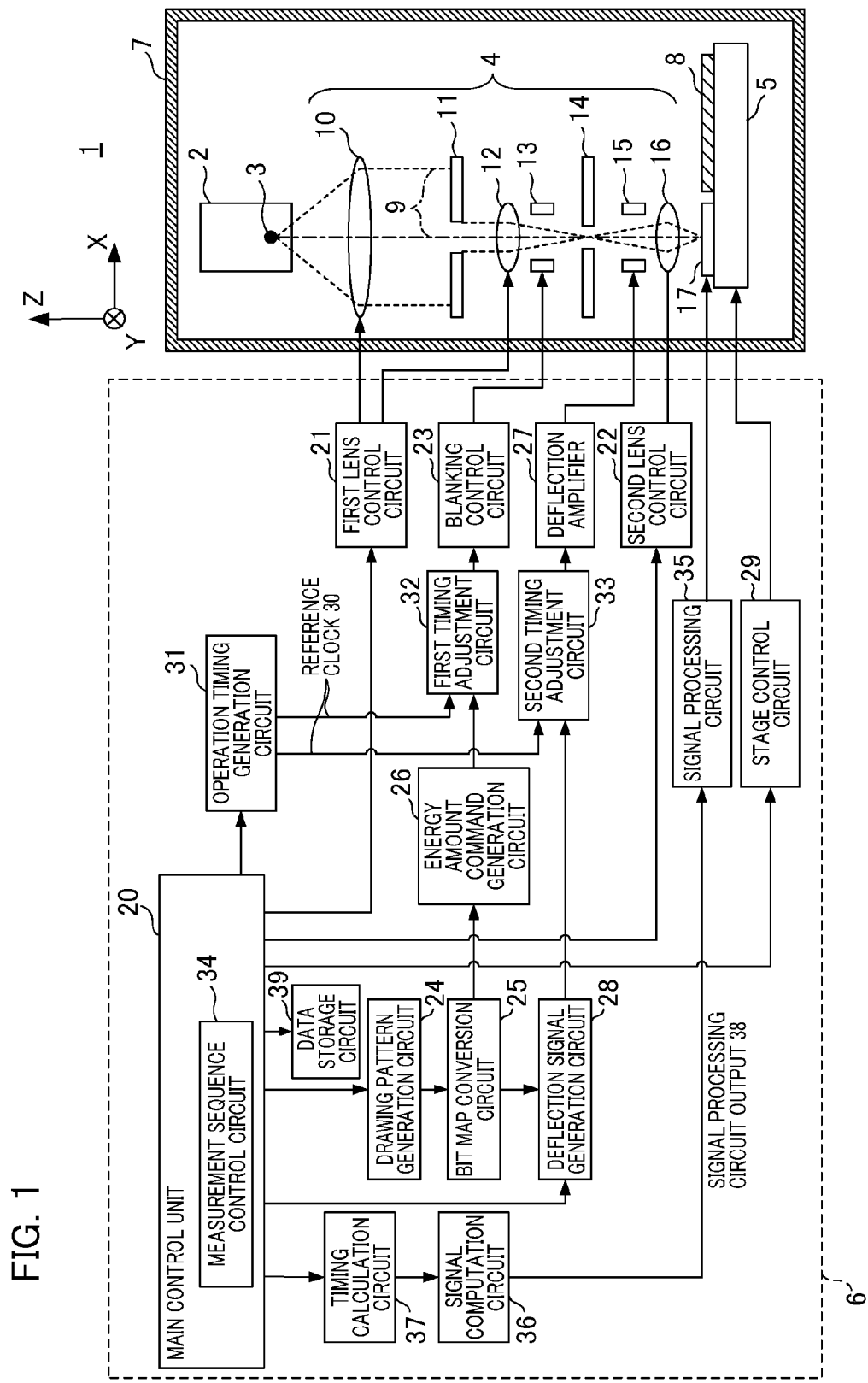
FIG. 1 is a diagram illustrating the configuration of a charged particle beam drawing apparatus according to one embodiment of the present invention.

Firstly, a description will be given of a charged particle beam drawing apparatus (hereinafter referred to simply as "drawing apparatus") according to a first embodiment of the present invention. Hereinafter, each of the drawing apparatuses to be described in the following embodiments is intended to employ a multiple beam system in which a single or a plurality of electron beams (charged particle beams) is deflected and the ON/OFF (irradiation/nonirradiation) operation of the irradiation of electron beams is independently controlled so as to draw predetermined drawing data on the predetermined position of a substrate to be treated. Here, a charged particle beam of the present embodiment is not limited to an electron beam, but may be other charged particle beams such as an ion beam. FIG. 1 is a diagram illustrating the configuration of a drawing apparatus 1 according to one embodiment. Also, in the following drawings, a description will be given in which the Z axis is in an irradiation direction of an electron beam to a substrate to be treated, and the X axis and the Y axis are mutually oriented in directions orthogonal to a plane perpendicular to the Z axis. The drawing apparatus 1 includes an electron gun 2, an optical system 4 that splits an electron beam emitted from a crossover 3 of the electron gun 2 into a plurality of electron beams, and deflects and focuses the plurality of electron beams, a substrate stage 5 that holds a substrate to be treated, and a controller 6 that controls the operation of the components of the drawing apparatus 1. Note that an electron beam is readily attenuated under an atmosphere at normal pressure and is also discharged under high voltage. In order to prevent such phenomena, the components are installed in a vacuum chamber 7. In particular, the installation space of the electron gun 2 and the optical system 4 is held at a high vacuum. Also, a substrate to be treated 8 of the present embodiment is a wafer consisting of, for example, single crystal silicon. A photosensitive resist is coated on the surface of the substrate to be treated 8.

The electron gun 2 has a mechanism that emits electron beams by applying heat or electric field. In FIG. 1, tracks 9 of electron beams emitted from the crossover 3 are shown by dotted lines. The optical system 4 includes a collimator lens 10, an aperture array 11, a first electrostatic lens 12, a blanking deflector array 13, a blanking aperture 14, a deflector 15, and a second electrostatic lens 16 in the recited order from the electron gun 2 to the substrate stage 5. First, the collimator lens 10 is an optical element that is constituted by an electromagnetic lens and collimates electron beams emitted from the crossover 3 into collimated beams. The aperture array 11 is a mechanism that has a plurality of circular openings arranged in a matrix form and splits an electron beam incident from the collimator lens 10 into a plurality of electron beams. The first electrostatic lens 12 is an optical element that is constituted by three electrode plates (in FIG. 1, three electrode plates are shown integrally as an integral plate) each having a circular opening and focuses electron beams to the blanking aperture 14. Both of the blanking deflector array 13 and the blanking aperture 14 are mechanisms that are arranged in a matrix form and perform the ON (non-blanking state)/OFF (blanking state) operation of the irradiation of each electron beam. In particular, the blanking aperture 14 is arranged at a position at which the first electrostatic lens 12 first forms the crossover of electron beams. Hereinafter, the blanking deflector array 13 is simply referred to as a "blanking deflector (first deflector) 13", which is a unit for independently switching the ON/OFF operation of the irradiation of electron beams in the blanking deflector array. A deflector (position control deflector, second deflector) 15 is a mechanism that deflects an image on the surface of the substrate to be treated 8, which is placed on the substrate stage 5, in the X direction. As described above, in the optical system 4 of the present embodiment, two deflectors: the blanking deflector 13 and the deflector 15 are employed. Furthermore, the second electrostatic lens 16 is an optical element that focuses electron beams, which have passed through the blanking aperture 14, onto the substrate to be treated 8 or focuses the image of the original crossover 3 onto an electron beam detector 17 on the substrate stage 5 to be described below.

The substrate stage (substrate holding unit) 5 holds the substrate to be treated 8 using, for example, electrostatic attraction and is movable to the irradiation position of the electron beam in the XY plane. Also, the substrate stage 5 is loaded with the electron beam detector (detector) 17 that detects charge amount depending on the irradiation of the electron beam. The electron beam detector of the present embodiment is a current detector that detects an electron beam and outputs its current value. Also, the electron beam detector 17 may be installed at any position as long as the electron beam detector 17 does not prevent the incidence of the electron beam and is movable in synchrony with the substrate stage 5. As shown in FIG. 1, the electron beam detector 17 of the present embodiment is provided at an area at the end of the surface of the substrate stage 5 on which the substrate to be treated 8 is placed. For example, the electron beam detector 17 may also be provided on the side surface of the substrate stage 5.

The controller 6 has various control circuits that control the operation of the components related to drawing with the drawing apparatus 1, and a main control unit 20 that supervises the control circuits. Firstly, a first lens control circuit 21 controls the operation of the collimator lens 10 and the first electrostatic lens 12, and a second lens control circuit 22 controls the operation of the second electrostatic lens 16. A blanking control circuit 23 controls the operation of the blanking deflector 13 based on a blanking signal generated by a drawing pattern generation circuit 24, a bit map conversion circuit 25, and an energy amount command generation circuit 26. A deflection amplifier (position control deflection amplifier) 27 controls the operation of the deflector 15 based on a deflection signal generated by a deflection signal generation circuit 28. A stage control circuit 29 controls the driving of the substrate stage 5 in the X and Y directions. In particular, during pattern drawing, the stage control circuit 29 continuously scans the substrate to be treated 8 (the substrate stage 5) in the Y direction. At this time, the deflector 15 deflects an image on the surface of the substrate to be treated 8 in the X direction based on the length measurement result of the substrate stage 5 obtained by a laser length measuring machine or the like, and the blanking deflector 13 performs the ON/OFF operation of the irradiation of the electron beam in synchrony with the timing required for drawing. The ON/OFF operation of the electron beam by the blanking deflector 13 is very fast as compared with the beam position deflection operation of a typical position control deflector.

Also, the controller 6 has an operation timing generation circuit 31 that supplies a reference clock 30 based on an operation start command from the main control unit 20 to each of the blanking control circuit 23 and a deflection amplifier 27. Further, the controller 6 has a first timing adjustment circuit 32 provided between the energy amount command generation circuit 26 and the blanking control circuit 23 and a second timing adjustment circuit 33 provided between the deflection signal generation circuit 28 and the deflection amplifier 27. Each of the first and the second timing adjustment circuits 32 and 33 is a timing adjustment unit that generates an appropriate timing by receiving the reference clock 30 from the operation timing generation circuit 31 to thereby supply (transmit) clock to a clock to each of the blanking control circuit 23 and the deflection amplifier 27. Further, the main control unit 20 includes a measurement sequence control circuit 34 provided therein. The measurement sequence control circuit 34 is a sequence control unit that directs a measurement sequence to each of the blanking control circuit 23 and the deflection amplifier 27 when determining the parameters to be set to the first and the second timing adjustment circuits 32 and 33. Here, the term "different measurement sequence" refers to a sequence different from that in typical rendering operation, and at which the measurement sequence control circuit 34 operates the deflectors at a different phase or a different duty ratio to be described below. Also, the controller 6 has a signal processing circuit 35, a signal computation circuit 36, and a timing calculation circuit 37. The signal processing circuit 35 detects a signal (current value) from the electron beam detector 17 when the deflectors are operated in a measurement sequence. The signal computation circuit 36 calculates an integrated value, for example, when the signal processing circuit 35 is an integrator, based on a signal output (signal processing circuit output) 38 from the signal processing circuit 35. Furthermore, the timing calculation circuit 37 is a timing calculation unit that calculates the lag time in operation of the blanking control circuit 23 and the deflection amplifier 27 based on the signal output 38 to thereby set the calculated lag time as the parameter for the first and the second timing adjustment circuits 32 and 33. Still further, the controller 6 includes a data storage circuit 39 that stores various data for use when the main control unit 20 integrally executes a drawing operation or the like, and data regarding various control circuits or the like.

Next, a description will be given of the operation of the drawing apparatus 1. When a position control deflector is employed as the deflector 15, the output voltage needs to have a settling time (settling time for settling the electron beam at the target deflection position) depending on the load applied thereto during driving of the deflector 15 as described above. Thus, if the electron beam is illuminated onto the substrate to be treated 8 during the settling time, such illumination may adversely affect the drawing result. Thus, in the present embodiment, the timing at which the activation of the blanking deflector 13 is started is appropriated adjusted in synchrony with the timing at which a voltage is applied to the deflector 15 during the movement of the irradiation position of the electron beam, whereby the irradiation of the electron beam onto the substrate to be treated 8 during the settling time is avoided.

Figure 2:
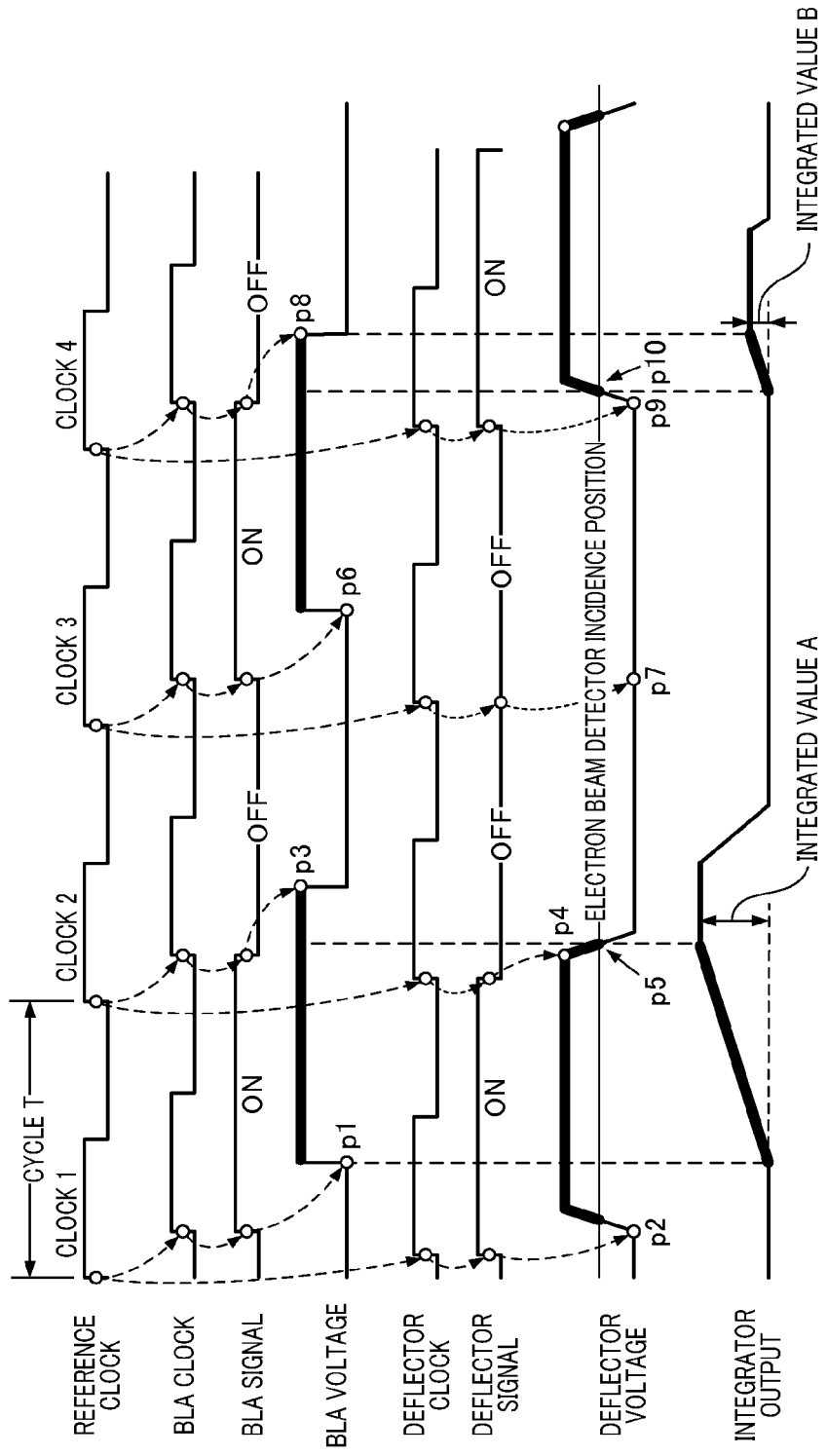
FIG. 2 is a diagram illustrating a timing adjusting step according to a first embodiment in a time-series manner.

FIG. 2 is a diagram illustrating a timing adjusting step according to the present embodiment in a time-series manner. In FIG. 2, a reference clock indicates the reference clock 30 having the cycle T, which is supplied from the operation timing generation circuit 31. A BLA clock indicates a clock that is supplied to the blanking control circuit 23 by adjusting the timing of the reference clock by the first timing adjustment circuit 32. On the other hand, a deflector clock indicates a clock that is supplied to the deflection amplifier 27 by adjusting the timing of the reference clock by the second timing adjustment circuit 33. Also, a BLA signal indicates a signal that is synchrony with the rising edge of the BLA clock and switches the ON/OFF operation of the blanking deflector 13. A deflector signal indicates a signal that is synchrony with the rising edge of the deflector clock and switches the ON/OFF operation of the deflector 15. A BLA voltage indicates a voltage that is output to the blanking deflector 13 by receiving the BLA signal. On the other hand, a deflector voltage indicates a voltage that is output to the deflector 15 by receiving the deflector signal. Furthermore, in the present embodiment, the signal processing circuit 35 is an integrator, and an integrated value output in this case is also described in FIG. 2.

Figure 3:
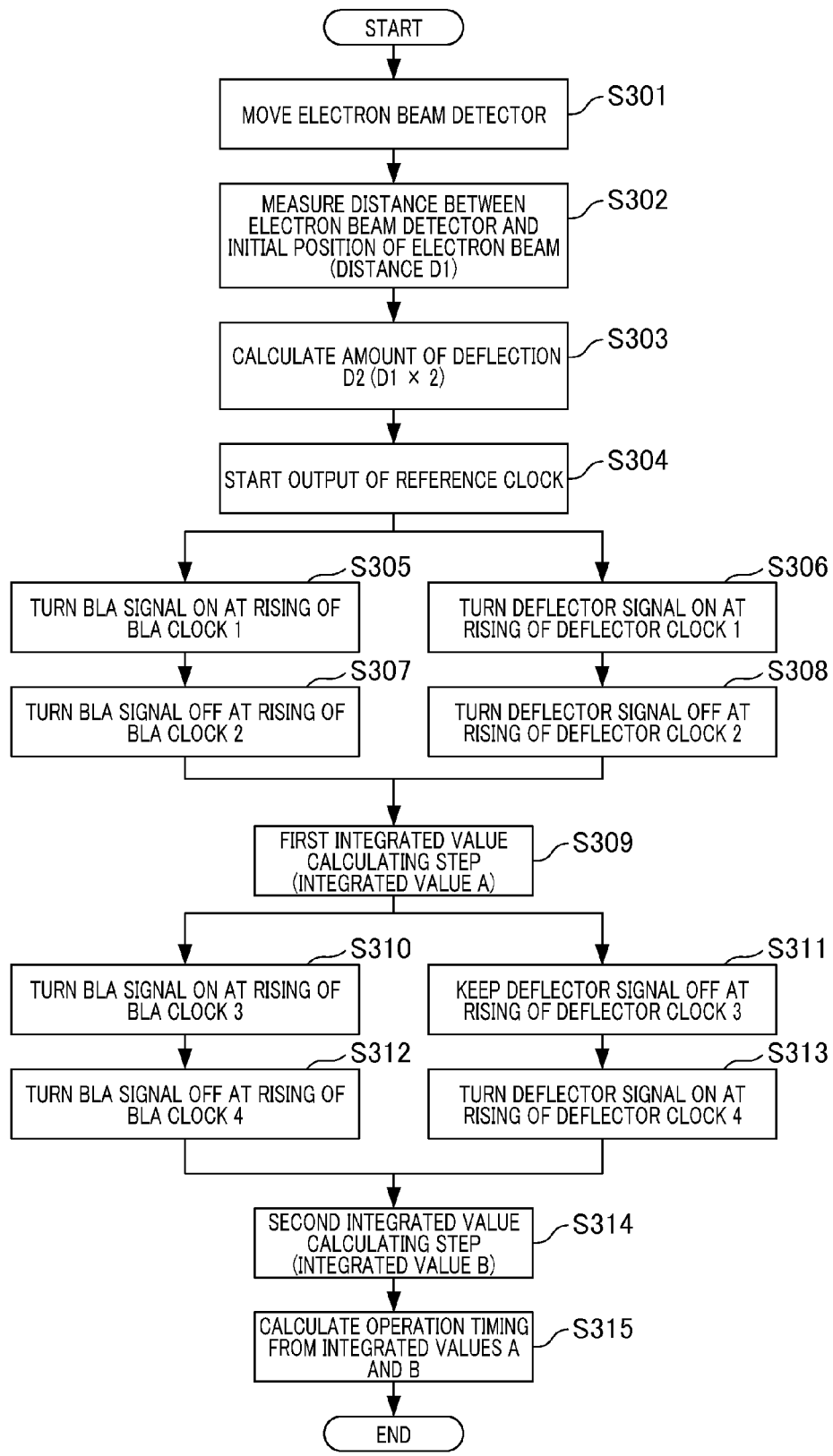
FIG. 3 is a flowchart illustrating the timing adjusting step according to the first embodiment.

FIG. 3 is a flowchart illustrating the flow of the timing adjusting step. Points p1 to p10 described in the following explanation correspond to the points (instruction positions) shown in FIG. 2. First, the main control unit 20 drives the substrate stage 5 via the stage control circuit 29, and moves the electron beam detector 17 to the position onto which the electron beam is emitted in the amount of deflection which is sufficiently smaller than the width to which the electron beam can be deflected by the deflector 15 (step S301). Next, the controller 6 measures a distance D1 between the electron beam detector 17 and the initial position of the electron beam (step S302). The distance D1 can be calculated based on the amount of movement of the substrate stage 5, for example, by moving the substrate stage 5 while the irradiation of the electron beam is ON by the main control unit 20 until the electron beam detector 17 detects the electron beam. Next, the measurement sequence control circuit 34 sets the distance twice as much as the distance D1 measured in step S302 as the amount of deflection D2 in one clock to the deflection signal generation circuit 28 with regard to the deflector 15 (step S303). At the same time, the measurement sequence control circuit 34 sets the output of the energy amount command generation circuit 26 to the drawing pattern generation circuit 24 with regard to the blanking deflector 13 such that the output of the energy amount command generation circuit 26 is performed at full-dose (the time of the cycle T).

Next, the operation timing generation circuit 31 starts the output of a reference clock (step S304). Here, the reference clock is supplied to the blanking control circuit 23 and the deflection amplifier 27 via the first and the second timing adjustment circuits 32 and 33, respectively. First, the blanking control circuit 23 outputs a voltage corresponding to ON to the blanking deflector 13 by the input of a BLA clock 1 (corresponding to the clock 1 of the reference clock) (p1; step S305). On the other hand, the deflection amplifier 27 outputs a voltage corresponding to the amount of deflection D2 to the deflector 15 by the input of a deflector clock 1 (corresponding to the clock 1 of the reference clock) (p2; step S306). Here, for the inclination of the rising portion of the deflector voltage shown in FIG. 2, the vertical axis represents the rising time and the horizontal axis represents the settling time. Next, the blanking control circuit 23 outputs a voltage corresponding to OFF to the blanking deflector 13 by the input of a BLA clock 2 (corresponding to the clock 2 of the reference clock) (p3; step S307). On the other hand, the deflection amplifier 27 outputs a negative voltage corresponding to the amount of deflection D2 to the deflector 15 by the input of the deflector clock 2 (corresponding to the clock 2 of the reference clock) (p4; step S308). In steps S305 to S308, the electron beam detector 17 detects current for the period of time only when the blanking deflector 13 is ON (in a non-blanking state) and the deflector 15 is deflecting the electron beam to the light-receiving unit of the electron beam detector 17. In this case, the detection time is the time starting from p1 to p5 which is at the position (corresponding to the incidence position of the electron beam detector 17) corresponding to the half of the falling portion of the deflector voltage passed through p4 in a time-series manner as shown in FIG. 2. Then, the signal computation circuit 36 receives the detected current and calculates an integrated value A which is the value of the signal output 38 to be output by the signal processing circuit 35 (first integrated value calculating step: step S309). Next, the blanking control circuit 23 outputs a voltage corresponding to ON to the blanking deflector 13 by the input of a BLA clock 3 (corresponding to the clock 3 of the reference clock) (p6; step S310). On the other hand, the deflection amplifier 27 outputs a voltage corresponding to OFF, i.e., stopped state (the amount of deflection is zero), to the deflector 15 by the input of a deflector clock 3 (corresponding to the clock 3 of the reference clock) (p7; step S311). Next, the blanking control circuit 23 outputs a voltage corresponding to OFF to the blanking deflector 13 by the input of a BLA clock 4 (corresponding to the clock 4 of the reference clock) (p8; step S312). On the other hand, the deflection amplifier 27 outputs a voltage corresponding to the amount of deflection D2 to the deflector 15 by the input of a deflector clock 4 (corresponding to the clock 4 of the reference clock) (p9; step S313). Also in steps S310 to S313, the electron beam detector 17 detects current for the period of time only when the blanking deflector 13 is ON (in a non-blanking state) and the deflector 15 is deflecting the electron beam to the light-receiving unit of the electron beam detector 17. In this case, the detection time is the time starting from p10 which is at the position corresponding to the half of the rising portion of the deflector voltage passed through p9 to p8 in a time-series manner as shown in FIG. 2. Then, as in the first integrated value calculating step in step S309, the signal computation circuit 36 receives the detected current and calculates an integrated value B which is the value of the signal output 38 to be output by the signal processing circuit 35 (second integrated value calculating step: step S314).

Next, the timing calculation circuit 37 calculates an operation timing offset between the blanking deflector 13 and the deflector 15 based on the integrated value A acquired in step S309 and the integrated value B acquired in S314 (step S315). More specifically, the timing calculation circuit 37 can calculate the amount of an operation time offset "t_err" between the blanking deflector 13 and the deflector 15 using the following Formula (1) when the cycle of the reference clock is given as T as described above.

$$t\_err = T \times \text{integrated value } B/(\text{integrated value } A + \text{integrated value } B) \quad (1)$$

Here, the sum of (the integrated value A+the integrated value B) in Formula (1) indicates a current value based on the assumption that the blanking deflector 13 is fully synchronized with the deflector 15. On the other hand, since the operation cycle of each of the blanking deflector 13 and the deflector 15 is equal to the clock cycle T, the integrated value B in Formula (1) is an integrated value of the amount of offset between the blanking deflector 13 and the deflector 15. In other words, the term "the integrated value B/(the integrated value A+the integrated value B)" in Formula (1) indicates the proportion of the offset relative to the total. Thus, when the cycle T is multiplied by the proportion as shown in Formula (1), the resulting product is the amount of an operation time offset between the blanking deflector 13 and the deflector 15.

Note that the parameters that are set to the first timing adjustment circuit 32 for supplying a BLA clock and the second timing adjustment circuit 33 for supplying a deflector clock are determined by the following method. First, given that the settling time of the deflector 15, which has been empirically obtained in advance, is "t1", the timing calculation circuit 37 can determine a parameter setting value by the computation as shown in the following Formula (2). In contrast, when further synchronization of the operation timing is wished to be realized, the arrival time "tp" to the position of 50% of the target position of the deflector 15, which has been obtained by measuring the deflector 15 alone in advance, may be applied as shown in the following Formula (3).

$$\text{Parameter setting value} = t\_err - (t1/2) \quad (2)$$

$$\text{Parameter setting value} = t\_err - (t1 - tp) \quad (3)$$

As described above, the drawing apparatus 1 of the present embodiment calculates parameters to be set to the first and the second timing adjustment circuits 32 and 33 based on the amount of an operation time offset between the blanking deflector 13 and the deflector 15 prior to drawing processing to the substrate to be treated 8. In this manner, since the operation start timing of the blanking deflector 13 coincide with the timing at which a voltage is applied to the deflector 15 during the movement of the irradiation position of the electron beam, depending on interpolation of the lag time represented by the amount of offset described above in the drawing processing step. Thus, the irradiation of the electron beam onto the substrate to be treated 8 during the settling time may be avoided. In other words, a drawing apparatus that adjusts the operation timing between the blanking deflector 13 and the deflector 15 at high speed with high accuracy and is advantageous in achieving further improvements in drawing throughput may be provided.

(Second Embodiment)

Figure 4:
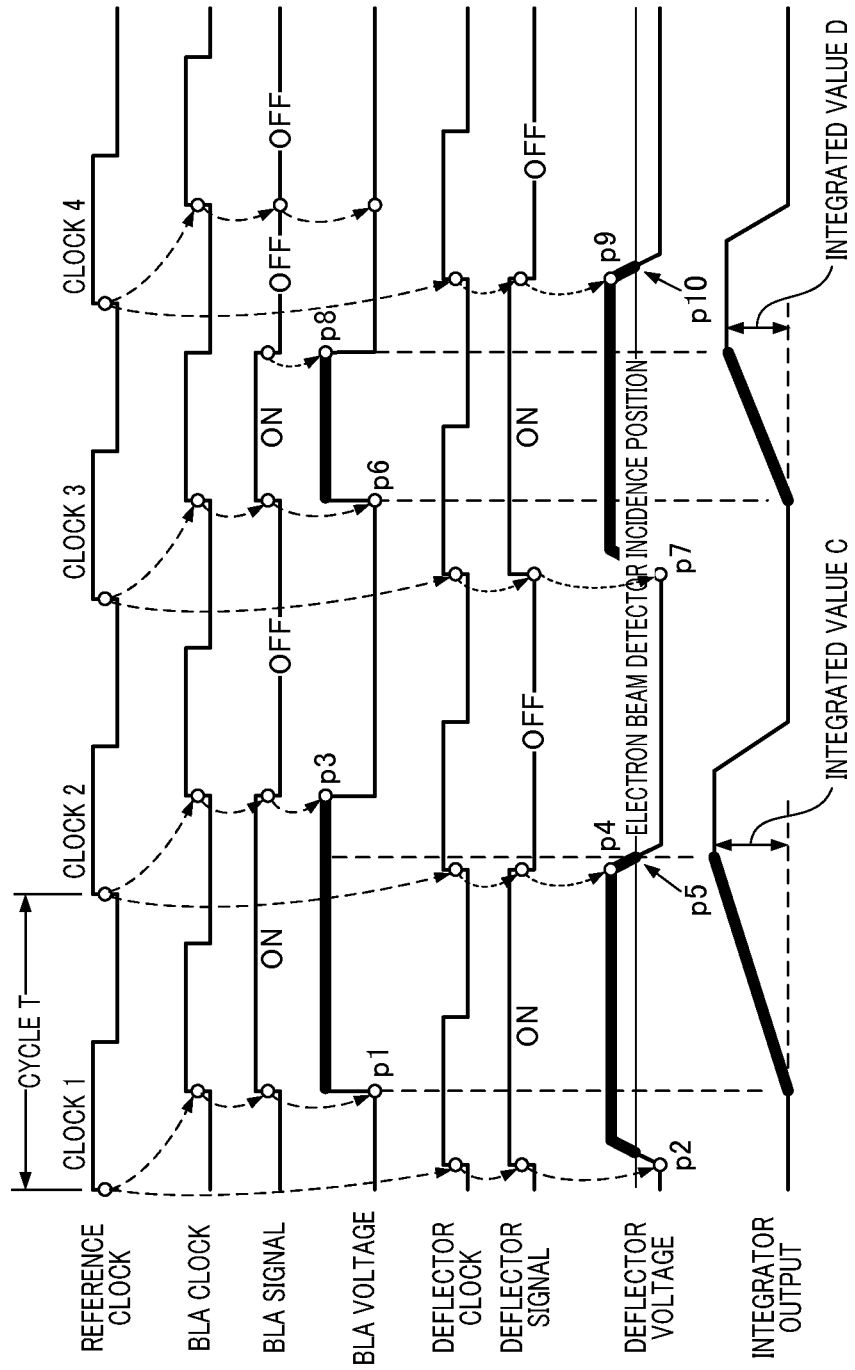
FIG. 4 is a diagram illustrating a timing adjusting step according to a second embodiment in a time-series manner.
Figure 5:
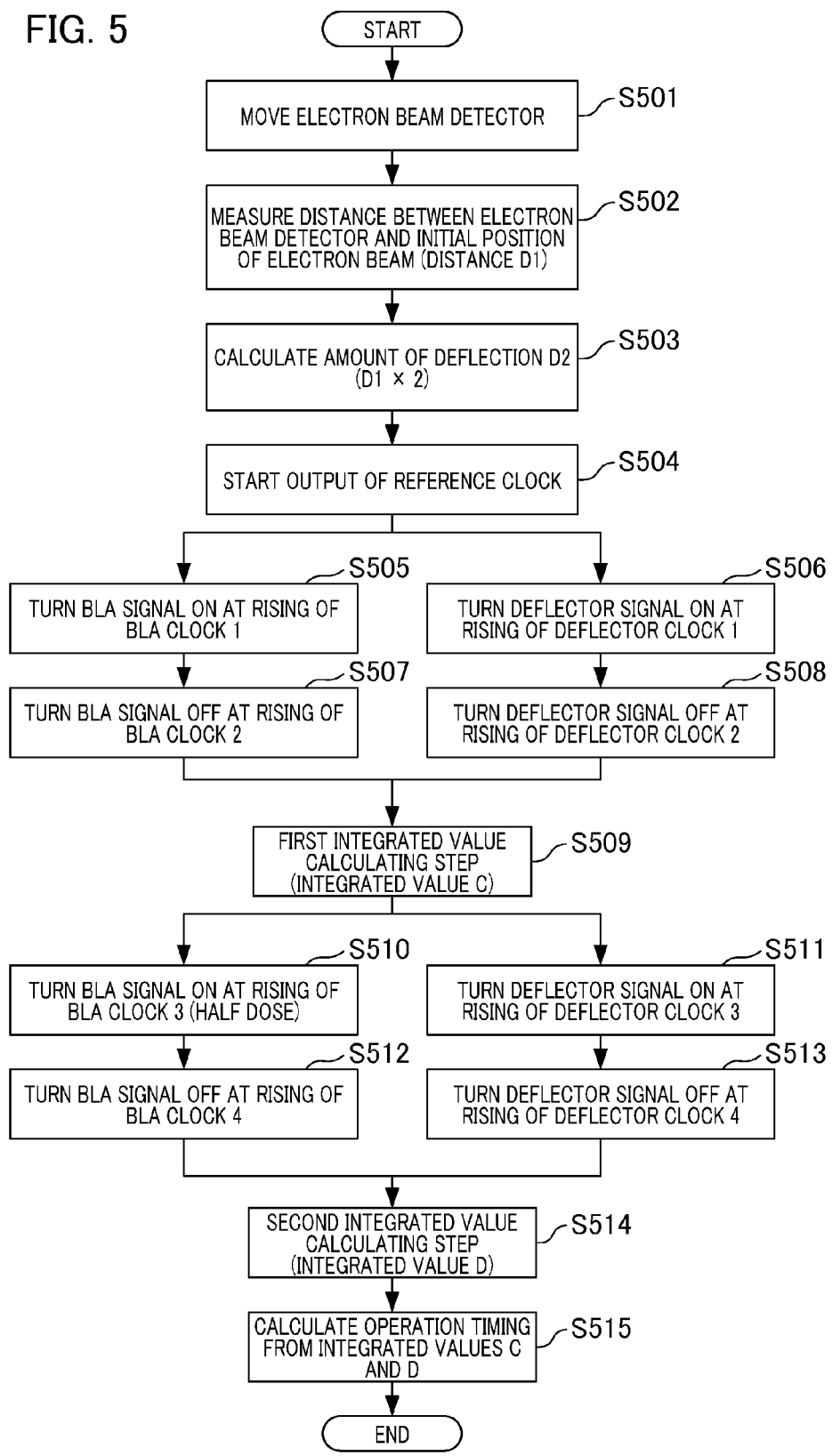
FIG. 5 is a flowchart illustrating the timing adjusting step according to the second embodiment.

Next, a description will be given of a drawing apparatus according to a second embodiment of the present invention. The second embodiment of the present invention is the variant example of the timing adjusting step of the first embodiment. A feature of the drawing apparatus of the present embodiment lies in the fact that the output of the energy amount command generation circuit 26 is set to the drawing pattern generation circuit 24 such that the output becomes a half of full-dose during operation at the next clock to a clock. The configuration of the drawing apparatus of the present embodiment is the same as that of the drawing apparatus 1 of the first embodiment shown in FIG. 1. In the following description, the same elements as those in drawing apparatus 1 of the first embodiment shown in FIG. 1 are designated by the same reference numerals and explanation thereof will be omitted. FIG. 4 is a diagram illustrating the timing adjusting step of the present embodiment corresponding to the first embodiment shown in FIG. 2 in a time-series manner. FIG. 5 is a flowchart illustrating the flow of the timing adjusting step performed by the drawing apparatus of the present embodiment corresponding to the first embodiment shown in FIG. 3. Steps S501 to S509 shown in FIG. 5 are the same as steps S301 to S309 in FIG. 3 and explanation thereof will be omitted. Also, an integrated value to be calculated in a first integrated value calculating step in step S509 is described as an integrated value C so as to distinguish it from the notation of the first embodiment (the integrated value A).

In this case, after the signal computation circuit 36 has calculated the integrated value C in step S509 in FIG. 5, the blanking control circuit 23 outputs a voltage corresponding to ON to the blanking deflector 13 by the input of the BLA clock 3 during the time corresponding to a half of full-dose. Then, the blanking control circuit 23 outputs a voltage corresponding to OFF to the blanking deflector 13 (p6; step S510). On the other hand, the deflection amplifier 27 outputs a voltage corresponding to the amount of deflection D2 to the deflector 15 by the input of the deflector clock 3 (p7; step S511). Next, the blanking control circuit 23 outputs a voltage corresponding to OFF to the blanking deflector 13 by the input of the BLA clock 4 (p8; step S512). On the other hand, the deflection amplifier 27 outputs a negative voltage corresponding to the amount of deflection D2 to the deflector 15 by the input of the deflector clock 4 (p9; step S513). Here, also in steps S510 to S513, the electron beam detector 17 detects current for the period of time only when the blanking deflector 13 is ON and the deflector 15 is deflecting the electron beam to the light-receiving unit of the electron beam detector 17. The detection time in this case is the time starting from p6 to p8 in a time-series manner shown in FIG. 4. Then, the signal computation circuit 36 receives the detected current and calculates an integrated value D which is the value of the signal output 38 to be output by the signal processing circuit 35 (second integrated value calculating step: step S514).

Next, as in the first embodiment, the timing calculation circuit 37 calculates an operation timing offset between the blanking deflector 13 and the deflector 15 based on the integrated value C acquired in step S509 and the integrated value D acquired in S514 (step S515). In the present embodiment, given that the cycle of the reference clock is "T", the amount of an operation time offset between the blanking deflector 13 and the deflector 15 is "t_err", and the exposure dose of the electron beam per unit time is "S", the following Formulae (4) and (5) relating to the integrated values C and D are satisfied:

$$\text{Integrated value } C = S \times (T - t\_err) \quad (4)$$

$$\text{Integrated value } D = S \times (T/2) \quad (5)$$

Here, the following Formula (6) relating to t_err is obtained by Formulae (4) and (5):

$$t\_err = T - [\text{integrated value } C/\{\text{integrated value } D/(T/2)\}] \quad (6)$$

Thus, the timing calculation circuit 37 can determine the parameters of the first and the second timing adjustment circuits 32 and 33 by substituting t_err obtained in Formula (6) into Formulae (2) and (3) shown in the first embodiment. In this way, according to the present embodiment, the same effects as those of the drawing apparatus 1 of the first embodiment may be provided.

(Third Embodiment)

Figure 6:
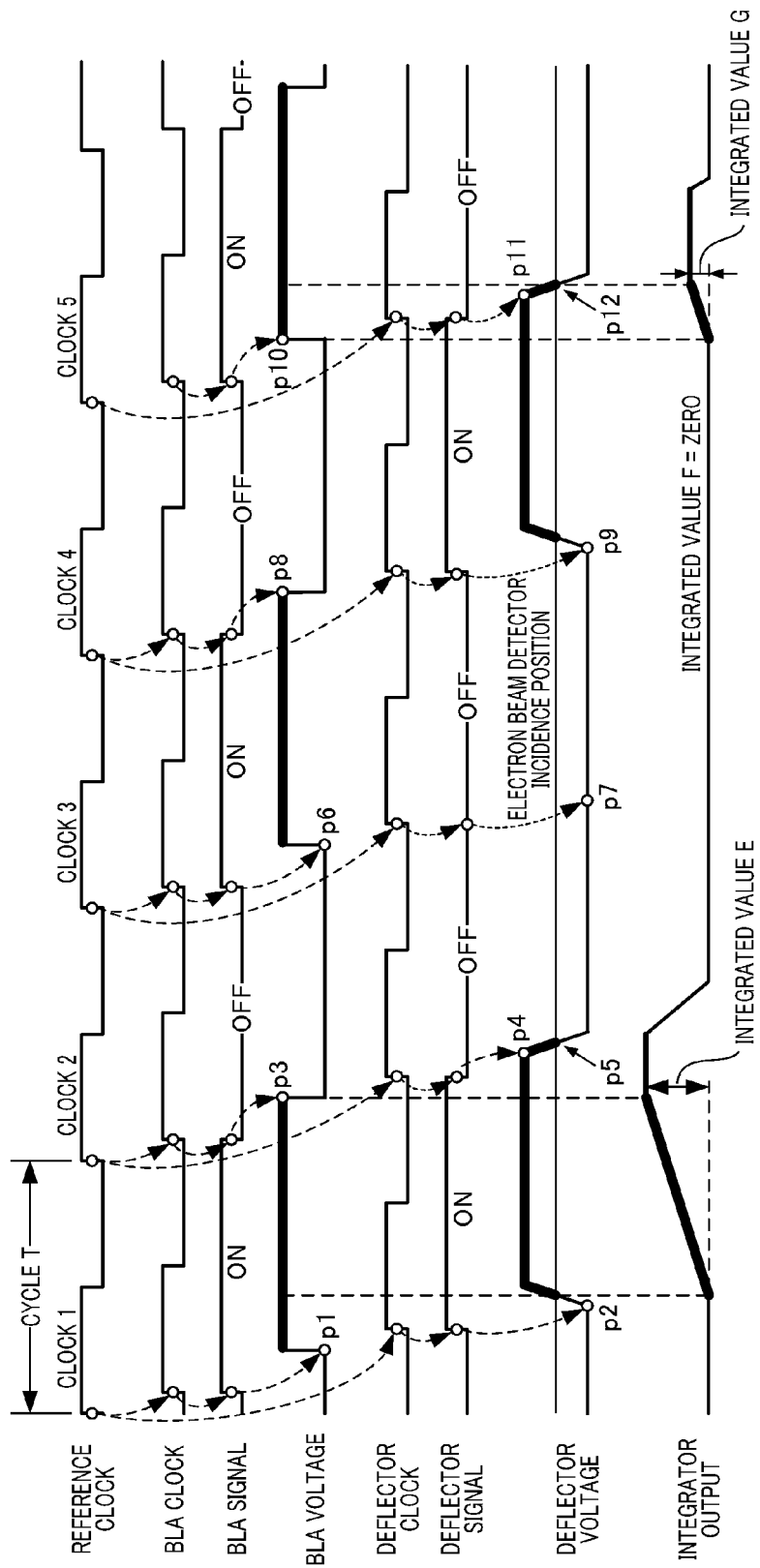
FIG. 6 is a diagram illustrating a timing adjusting step according to a third embodiment in a time-series manner.

Next, a description will be given of a drawing apparatus according to a third embodiment of the present invention. A feature of the drawing apparatus of the present embodiment lies in the fact that the operation timing of the blanking deflector 13 and the deflector 15 is in the reverse of the operation timing of the first embodiment. In other words, the drawing apparatus of the present embodiment is applicable when the blanking deflector 13 operates faster than the deflector 15. The configuration of the drawing apparatus of the present embodiment is also the same as that of the drawing apparatus 1 of the first embodiment shown in FIG. 1. In the following description, the same elements as those in drawing apparatus 1 of the first embodiment shown in FIG. 1 are designated by the same reference numerals and explanation thereof will be omitted. FIG. 6 is a diagram illustrating the timing adjusting step of the present embodiment corresponding to the first embodiment shown in FIG. 2 in a time-series manner. FIG. 7 is also a flowchart illustrating the flow of the timing adjusting step performed by the drawing apparatus of the present embodiment corresponding to the first embodiment shown in FIG. 3. Steps S701 to S713 shown in FIG. 7 are the same as steps S301 to S313 in FIG. 3 and explanation thereof will be omitted. Also, an integrated value to be calculated in a first integrated value calculating step in step S709 is described as an integrated value E so as to distinguish it from the notation of the first embodiment (the integrated value A).

Here, in steps S310 to S313 shown in FIG. 3 according to the first embodiment, the electron beam detector 17 detects current for the period of time only when the blanking deflector 13 is ON and the deflector 15 is deflecting the electron beam to the light-receiving unit of the electron beam detector 17. In contrast, in steps S710 to S713 according to the present embodiment, the state in which the blanking deflector 13 is ON doe not overlap the state in which the deflector 15 is deflecting the electron beam to the light-receiving unit of the electron beam detector 17. In other words, an integrated value F calculated by the signal computation circuit 36 is zero during steps S710 and S713 (second integrated value calculating step: step S714). Thus, the measurement sequence control circuit 34 can determine whether the operation timing of either the blanking deflector 13 or the deflector 15 is faster than the other using the integrated value acquired in step S714. More specifically, the measurement sequence control circuit 34 determines that the operation timing of the blanking deflector 13 is faster than that of the deflector 15 when the integrated value is zero, whereas the measurement sequence control circuit 34 determines that the operation timing of the deflector 15 is faster than that of the blanking deflector 13 when the integrated value has a certain value. Next, the blanking control circuit 23 outputs a voltage corresponding to ON to the blanking deflector 13 by the input of a BLA clock 5 (corresponding to the clock 5 of the reference clock) (p10; step S715). On the other hand, the deflection amplifier 27 outputs a negative voltage corresponding to the amount of deflection D2 to the deflector 15 by the input of a deflector clock 5 (corresponding to the clock 5 of the reference clock) (p11; step S716). Here, also in steps S715 and S716, the electron beam detector 17 detects current for the period of time only when the blanking deflector 13 is ON and the deflector 15 is deflecting the electron beam to the light-receiving unit of the electron beam detector 17. The detection time in this case is the time starting from p10 to p12 which is at the position corresponding to the half of the falling portion of the deflector voltage passed through p11 in a time-series manner as shown in FIG. 6. Then, the signal computation circuit 36 receives the detected current and calculates an integrated value G which is the value of the signal output 38 to be output by the signal processing circuit 35 (third integrated value calculating step: step S717).

Next, the timing calculation circuit 37 only refers to the integrated value E acquired in step S709 and the integrated value G acquired in step S717 because the integrated value F is zero, and calculates an operation timing offset between the blanking deflector 13 and the deflector 15 (step S718). As in Formula (1) according to the first embodiment, the amount of an operation time offset "t_err" between the blanking deflector 13 and the deflector 15 can be calculated using the following Formula (7)

$$t\_err = T \times \text{integrated value } E/(\text{integrated value } E + \text{integrated value } G) \quad (7)$$

In this way, according to the present embodiment, the same effects as those of the drawing apparatus 1 of the first embodiment may be provided even when the blanking deflector 13 operates faster than the deflector 15.

While, in the above embodiments, two deflectors for the first timing adjustment circuit 32 and the second timing adjustment circuit 33 are employed as the optical system 4, the present invention is also applicable for the case where a greater number of deflectors is installed. Also, while, in the embodiments, a timing adjustment circuit is provided in each of the two deflectors, a timing adjustment circuit may also be provided in either one of the two deflectors.

(Article Manufacturing Method)

An article manufacturing method according to an embodiment of the present invention is preferred in, for example, manufacturing a micro device such as a semiconductor device or the like or an article such as an element or the like having a microstructure. The article manufacturing method may include the steps of forming, in a latent image pattern step (a step of rendering drawing data on a substrate), a latent image pattern on a substrate on which a photosensitizing agent is coated using the aforementioned drawing apparatus; and developing the substrate on which the latent image pattern has been formed in the latent image pattern step. Furthermore, the article manufacturing method may include other known steps (oxidizing, film forming, vapor depositing, doping, flattening, etching, resist peeling, dicing, bonding, packaging, and the like). The article manufacturing method of the present embodiment has an advantage, as compared with a conventional article manufacturing method, in at least one of performance, quality, productivity and production cost of an article.

While the embodiments of the present invention have been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Applications No. 2011-048529 filed Mar. 7, 2011, and Japanese Patent Application No. 2012-046126 filed Mar. 2, 2012 which are hereby incorporated by reference herein in their entirety.

What is claimed is:

1. A charged particle beam drawing apparatus that renders a pattern on a substrate using a charged particle beam, the charged particle beam drawing apparatus comprising:

a detector that detects charge amount depending on irradiation of the charged particle beam;

first and second deflectors that are arranged along a direction of the irradiation of the charged particle beam and are configured to deflect the charged particle beam; and a controller that controls the first and second deflectors, wherein the controller transmits a signal used for switching the irradiation to nonirradiation to the detector, and a signal used for switching the nonirradation to the irradiation to the detector to the first and second deflectors at a predetermined timing, calculates a lag time in operation start timings of the first and second deflectors based on a ratio between an output of the detector, depending on the signals and a value indicating the output of the detector in a case where no lag time exists in the operation start timings of the first and second deflectors, and adjusts the operation timing of the first and second deflectors based on the lag time.

2. The charged particle beam drawing apparatus according to claim 1, wherein the controller transmits the signal used for switching between the irradiation and the nonirradiation on a predetermined cycle, and calculates the lag time in the operation start timings based on the ratio and the cycle.

3. The charged particle beam drawing apparatus according to claim 2, wherein the controller transmits the signal used for switching the irradiation to the nonirradiation to the detector, and the signal used for switching the nonirradiation to the irradiation to the detector to the first and second deflectors at different phases.

4. The charged particle beam drawing apparatus according to claim 2, wherein the controller executes a drawing sequence and a measurement sequence different from the drawing sequence, and adjusts the operation timing of the first and second deflectors in the measurement sequence.

5. The charged particle beam drawing apparatus according to claim 4, wherein the controller transmits the signal used for switching the irradiation to the nonirradiation to the detector, and the signal used for switching the nonirradiation to the irradiation to the detector to the first and second deflectors at a phase or a duty ratio different from the drawing sequence in the measurement sequence.

6. The charged particle beam drawing apparatus according to claim 1, further comprising:

a substrate holding unit configured to be movable while holding the substrate, wherein the detector is mounted on the substrate holding unit.

7. The charged particle beam drawing apparatus according to claim 1, wherein the detector is a current detector that detects a current value depending on the irradiation of the charged particle beam.

8. An article manufacturing method comprising:

rendering drawing data on a substrate to be treated using an electron beam using a charged particle beam drawing apparatus; and developing the substrate rendered in the rendering, wherein the charged particle beam drawing apparatus comprises:

a detector that detects charge amount depending on the irradiation of the charged particle beam;

first and second deflectors that are arranged along the direction of the irradiation of the charged particle beam and are configured to deflect the charged particle beam; and a controller that controls the first and second deflectors, wherein the controller transmits a signal used for switching the irradiation to nonirradiation to the detector, and a signal used for switching the nonirradation to the irradiation to the detector to the first and second deflectors at a predetermined timing, calculates a lag time in operation start timings of the first and second deflectors based on a ratio between an output of the detector, depending on the signals and a value indicating the output of the detector in a case where no lag time exists in the operation start timings of the first and second deflectors, and adjusts the operation timing of the first and second deflectors based on the lag time.

\* \* \* \* \*